United States Patent
Lu et al.

(10) Patent No.: US 7,237,160 B2
(45) Date of Patent: Jun. 26, 2007

(54) SEMICONDUCTOR TEST MANAGEMENT SYSTEM AND METHOD

(75) Inventors: Ying-Lon Lu, Dashe Shiang (TW); Joshua Huang, Fuxing Xiang (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 280 days.

(21) Appl. No.: 10/963,863

(22) Filed: Oct. 13, 2004

(65) Prior Publication Data

US 2006/0080582 A1    Apr. 13, 2006

(51) Int. Cl.
*G01R 31/28* (2006.01)
*G01R 35/00* (2006.01)
*G06F 19/00* (2006.01)

(52) U.S. Cl. .................... 714/724; 702/117

(58) Field of Classification Search ............ None
See application file for complete search history.

(56) References Cited

U.S. PATENT DOCUMENTS

| | | | | |
|---|---|---|---|---|
| 4,845,843 A * | 7/1989 | Babcock | ............... | 29/829 |
| 5,355,320 A * | 10/1994 | Erjavic et al. | ............... | 716/4 |
| 6,493,425 B1 * | 12/2002 | Abe | ............... | 379/1.01 |
| 6,638,779 B2 * | 10/2003 | Taira | ............... | 438/17 |
| 2003/0229465 A1 * | 12/2003 | Kritt | ............... | 702/113 |

* cited by examiner

*Primary Examiner*—Cynthia Brett
*Assistant Examiner*—Steven D. Radosevich
(74) *Attorney, Agent, or Firm*—Thomas, Kayden, Horstemeyer & Risley

(57) ABSTRACT

A system and method thereof for semiconductor test management. A first computer generates a new gating rule and transmits the new gating rule. A second computer receives the new gating rule via a network, acquires a test result, carries the test result into the new gating rule to generate an advisory report. In which, the test result comprises a test value corresponding to a test attribute, the new gating rule determines a final advisory when the test value satisfies a specific condition comprising the test attribute, and the advisory report comprises the final advisory.

25 Claims, 9 Drawing Sheets

| Part# | STAGE | Subject Type | Rule | Advisory |
|---|---|---|---|---|
| TCCTA7 | SORT1 | Lot | YIELD<45 | Hold for Analysis |
| TCCTA7 | SORT2 | Lot | YIELD<40 | Hold for Analysis |
| TCCTA7 | SORT1 | Wafer | YIELD<40 | Hold for Analysis |
| TCCTA7 | SORT2 | Wafer | YIELD<30 | Hold for Analysis |
| TCCTA7 | SORT1 | Wafer | YIELD<24.7 | Scrap |
| TCCTA7 | SORT2 | Wafer | (SORT2:GOODDIE)-(SORT1:GOODDIE)/(SORT1:REPAIRDIE)<0.9 | Hold for Analysis |

FIG. 3

SEMICONDUCTOR TEST MANAGEMENT SYSTEM AND METHOD

BACKGROUND

The invention relates to semiconductor product test technology, and more particularly, to a method and system of gating rule synchronization for semiconductor device/product testing.

A conventional semiconductor factory typically includes the requisite fabrication tools to process semiconductor wafers for a particular purpose, such as photolithography, chemical-mechanical polishing, or chemical vapor deposition. During manufacture, the semiconductor wafer passes through a series of process steps performed by various fabrication tools. For example, in the production of an integrated semiconductor product, the semiconductor wafer passes through up to 600 process steps. The cost of such automated production is greatly influenced by how well and efficiently the manufacturing process can be monitored or controlled, so that the ratio of defect-free products to the overall number of products manufactured (i.e., yield ratio) achieves the greatest possible value. The individual process steps, however, are subject to fluctuations and irregularities, which in the worst case may mean, for example, the defect of a number of chips or the entire wafer. Therefore, each individual process step must be carried out as stably as possible in order to ensure an acceptable yield after the completed processing of a wafer.

Circuit probing (CP) testing systems/methods have been used in a variety of semiconductor fabrication processes for acquiring yield data. A test program is provided by a user or an operator for performing a CP test on a particular semiconductor product. The test program describes a test flow including multiple test items, and the test items are typically optimally arranged to reduce CP test time. A CP test station then follows the predefined test flow to sequentially probe all dies on a wafer to determine whether a die is good or bad. After completing the entire CP test, results of test attributes such as yield values, quantities of good dies, repairable dies, power short dies and the like, for wafers, wafer lots or semiconductor products, are acquired. Test results are subsequently carried into so-called gating rules to generate final advisories such as acceptance, scrap, hold for analysis and the like, for wafers, wafer lots or semiconductor products.

During manufacturing, the same type of semiconductor products may be tested by different labs or outsourcing test partners. In the past, gating rules in different labs or outsourcing test partners were created or refreshed manually. It has often been argued that final test result advisories for the same type of semiconductor products may be inconsistent due to inconsistencies in gating rule versions. Such gating rule version inconsistencies are often associated with delay refreshing of the up-to-date version or mistyping. Similar limitations are also occurred in in-line testing, wafer acceptance testing (WAT) or other semiconductor device/product testing. Therefore, a need exists for a system and method of semiconductor test management, thereby generating consistent final advisories.

SUMMARY

An embodiment of the invention provides a system for semiconductor test management. A first computer generates a new gating rule and transmits the new gating rule. A second computer receives the new gating rule via a network, acquires a test result, carries the test result into the new gating rule to generate an advisory report. In which, the test result comprises a test value corresponding to a test attribute, the new gating rule determines a final advisory when the test value satisfies a specific condition comprising the test attribute, and the advisory report comprises the final advisory.

In one example, the second computer may additionally replace an old gating rule version with the new gating rule. In another example, the second computer may additionally issue a request to the first computer to acquire the new gating rule, and the first computer may transmit the new gating rule after receiving the request. In yet another example, the first computer may additionally transmit multiple gating rule versions with version information thereof to the second computer, and the second computer may store the gating rule versions and acquire the newest gating rule version as the new gating rule. The second computer may store each gating rule version in a file with a file name comprising the corresponding version information, and acquire the newest gating rule version by detecting the file name. The second computer may store each gating rule version and the corresponding version information in a database table, and acquire the newest gating rule version by detecting the version information from the database table. The second computer may store each gating rule version and the corresponding version information in a data object, and acquire the newest gating rule version by detecting the version information from the data object.

Also disclosed is a method for experiment management. A new gating rule is generated and transmitted by a first computer. The new gating rule is received via a network by a second computer. A test result is acquired and the test result is carried into the new gating rule to generate an advisory report by the second computer.

A machine-readable storage medium storing a computer program which, when executed, performs the method of experiment management is also disclosed.

The test result may be generated by circuit probe (CP) testing, wafer acceptance test (WAT) or in-line testing. The new gating rule may be stored in a file or a message for data transmission between the first computer and the second computer, and the message may be an extensible markup language (XML) message or a simple object access protocol (SOAP) message. The new gating rule may be transmitted by file transfer protocol (FTP), simple mail transfer protocol (SMTP), simple object access protocol (SOAP) or hypertext transfer protocol (HTTP). The test attribute may comprise a yield value, quantity of good dies, quantity of repairable dies, quantity of bad dies, electrical parameters or physical parameters. The final advisory may correspond to a test subject, and the test subject may comprise a semiconductor device, a die, a wafer, a wafer or a semiconductor product. The final advisory may indicate that the test subject is accepted, scrapped, repairable or held for analysis.

BRIEF DESCRIPTION OF THE DRAWINGS

The aforementioned, features and advantages of embodiments of the invention will become apparent by referring to the following detailed description of embodiments with reference to the accompanying drawings, wherein:

FIG. 3 is a diagram of exemplary gating rules;

DESCRIPTION

Figure 1:
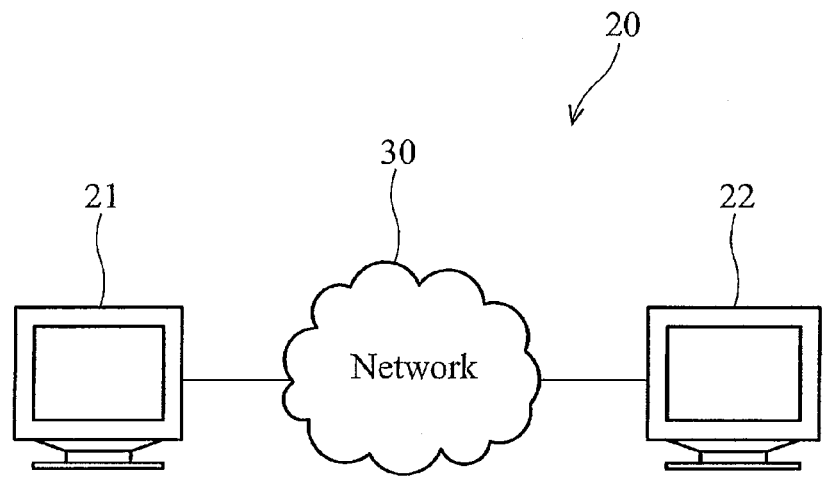
FIG. 1 is a diagram of a semiconductor test management system applicable to the first, second and third embodiments of the invention.

FIG. 1 is a diagram of a semiconductor test management system applicable to the first, second and third embodiments of the invention. The semiconductor test management system 20 comprises two computers 21 and 22. The computer 21 operates in a networked environment using logical connections to one or more remote computers, such as computer 22. When used in a LAN-networking environment, the computers 21 and 22 are connected to the local network through network interfaces or adapters. When used in a WLAN-networking environment, the computers 21 and 22 are connected to the local network through wireless network interfaces or adapters. When used in a WAN-networking environment, the computers 21 and 22 typically include ADSL modems or any other type of communication device for establishing communications over the wide area network, such as the Internet. Those skilled in the art will recognize that computers 21 and 22 may be connected in different types of networking environments, and communicate between different types of networking environments through various types of transmission devices such as routers, gateways, access points, base station systems or others.

Figure 2:
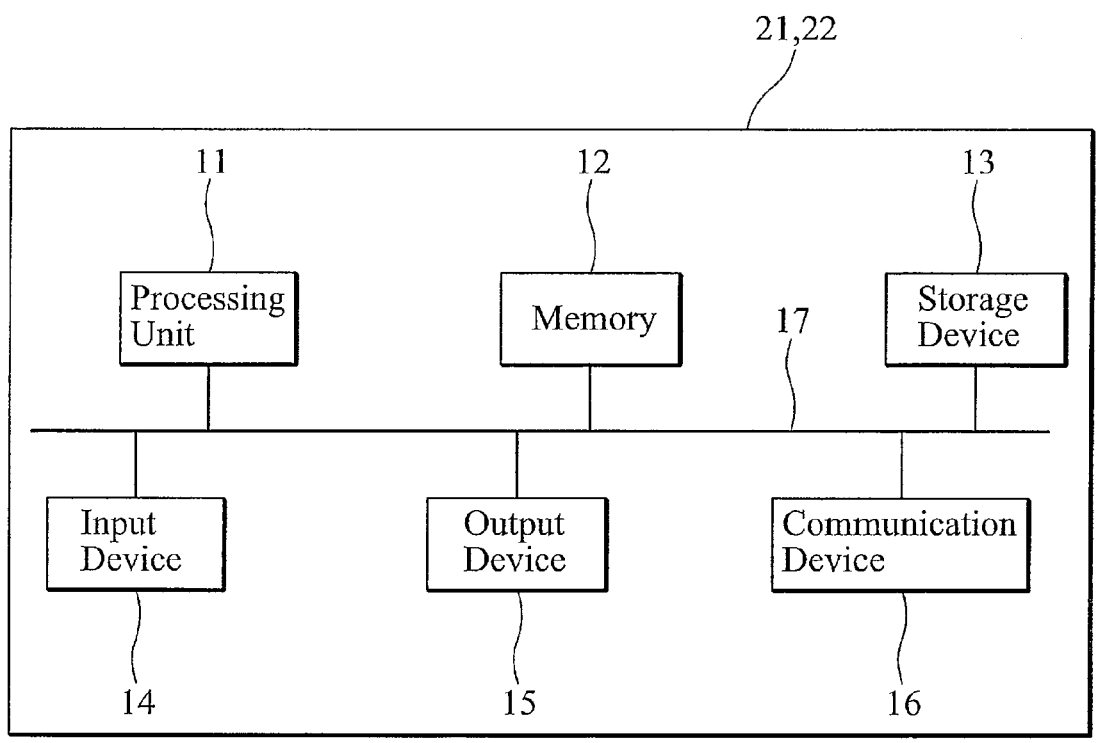
FIG. 2 is a diagram of a hardware environment applicable to computers in a semiconductor test management system.

FIG. 2 is a diagram of a hardware environment applicable to computers in a semiconductor test management system. The description of FIG. 2 provides a brief, general description of suitable computer hardware and a suitable computing environment for computers 21 and 22 in conjunction with which at least some embodiments of the invention may be implemented. The hardware environment of FIG. 2 includes a processing unit 11, a memory 12, a storage device 13, an input device 14, an output device 15 and a communication device 16. The processing unit 11 is connected by buses 17 to the memory 12, storage device 13, input device 14, output device 15 and communication device 16 based on Von Neumann architecture. There may be one or more processing units 21, such that the processor of the computer comprises a single central processing unit (CPU), a micro processing unit (MPU) or multiple processing units, commonly referred to as a parallel processing environment. The memory 12 is preferably a random access memory (RAM), but may also include read-only memory (ROM) or flash ROM. The memory 12 preferably stores program modules executed by the processing unit 11 to perform experiment management functions. Generally, program modules include routines, programs, objects, components, or others, that perform particular tasks or implement particular abstract data types. Moreover, those skilled in the art will understand that at least some embodiments may be practiced with other computer system configurations, including hand-held devices, multiprocessor-based, microprocessor-based or programmable consumer electronics, network PCs, mini-computers, mainframe computers, and the like. Some embodiments may also be practiced in distributed computing environments where tasks are performed by remote processing devices linked through a communication network. In a distributed computing environment, program modules may be located in both local and remote memory storage devices based on various remote access architecture such as DCOM, CORBA, Web objects, Web Services or other similar architectures. The storage device 13 may be a hard drive, magnetic drive, optical drive, a portable drive, or nonvolatile memory drive. The drives and associated computer-readable media thereof (if required) provide nonvolatile storage of computer-readable instructions, data structures, program modules, gating rules and gating rule versions (if required) The processing unit 11, controlled by program modules received from the memory 12 and from an operator through the input device, directs experiment management functions. The storage device 13 may comprise a database management system, an object base management system, a file management system, or others, for storing multiple gating rules and gating rule versions (if required).

FIG. 3 is a diagram of exemplary gating rules. Each gating rule determines a final advisory such as acceptance, scrap, hold for analysis and the like, for semiconductor devices, dies, wafers, wafer lots or semiconductor products when a CP test attribute such as yield value, quantities of good dies, repairable dies, and the like, or a mathematical operation of CP test attributes satisfying a particular condition. Such gating rules may be expressed as meta-rules (rule templates), as the maximum or minimum number of predicates that can occur in the rule antecedent or consequent, as relationships among test attributes, test attribute values, as equations comprising test attributes, and/or aggregates. For example, referring to row 321, a gating rule may determine that a wafer lot should be held for analysis when the yield value in the first testing stage is lower than forty-five. Referring to row 324, another gating rule may determine that a wafer should be held for analysis when the yield value in the first testing stage is lower to or equal to thirty. Referring to row 326, yet another gating rule may determine that a wafer should be held for analysis when the result of good die quantity in the first testing stage from good die quantity in the second testing stage, into repairable die quantity in the first testing stage is lower than 90 percent. Note that a wafer, wafer lot or semiconductor product may be accepted when test results satisfy no gating rules. Those skilled in the art will appreciate that additional or different gating rules may be provided.

FIRST EMBODIMENT

Figure 4:
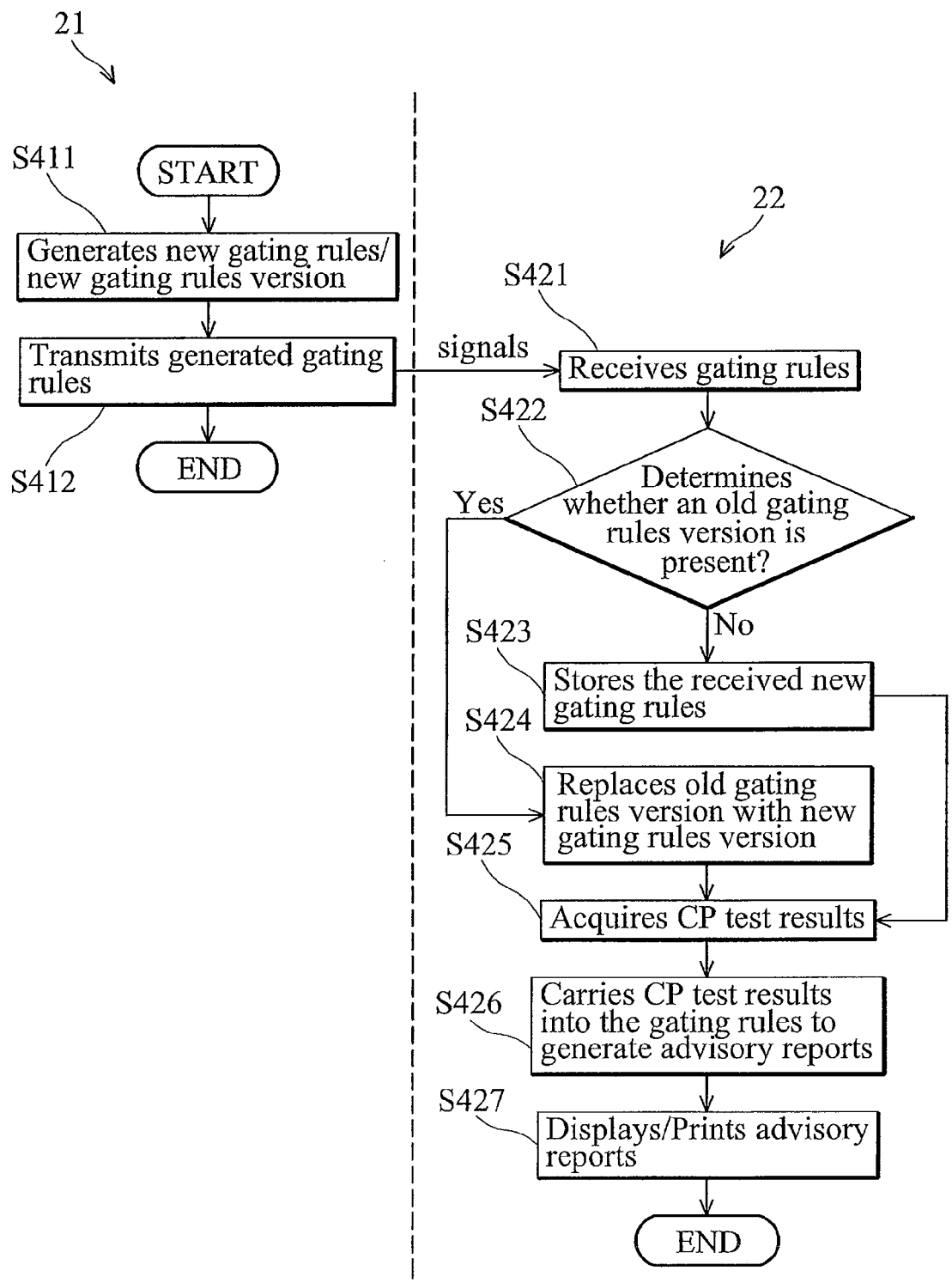
FIG. 4 is a flowchart showing a method of semiconductor test management according to a first embodiment of the invention.

A first embodiment of the invention discloses a method for semiconductor test management using a publishing strategy. The method is implemented in program modules, the parts of method executed by the processing unit 11 of computers 21, wherein some parts of the method are executed by the processing unit 11 of 22. FIG. 4 is a flowchart showing a method of semiconductor test management according to a first embodiment. The method of FIG. 4 is divided into two sections, a left section indicating the parts of the method performed by the computer 21, and a right section indicating the parts performed by the computer 22. The two sections shown in FIG. 4 are separated by a dashed line for added clarity.

In step S411, new gating rules or new versions of gating rules are generated by the computer 21. The computer 21 may provide a graphical user interface (GUI) to facilitate interaction with the generation of the gating rules, such as inserting a new rule, deleting a rule, modifying specification of a rule. The GUI can also provide additional response to information requests as required. Alternatively, the computer 21 may import new rules or new versions of rules provided by a client, from a file in a nonvolatile storage medium such as a hard disk, a floppy disk, an optical disk, a portable disk and the like, or a remote computer via the network 30. The generated gating rules may be stored to a file or message in a suitable format such as an ASCII text file, extensible markup language (XML) file, relational database export file, or simple object access protocol (SOAP) message. In step S412, the generated gating rules are transmitted to the computer 22 via a relevant network protocol such as file transfer protocol (FTP), simple mail transfer protocol (SMTP), SOAP, hypertext transfer protocol (HTTP) and the like, with a relevant software application such as a FTP client/server, SMTP client/server, SOAP message encoder, XML message encoder and the like.

In step S421, the computer 22 receives a file or a message comprising gating rules via its communication device 16. In step S422, it is determined whether old version gating rules are present, if so, the process proceeds to step S424, and otherwise, to step S423. The file name of the received file comprising gating rules may follow a naming rule to identify the gating rules version for a client, a semiconductor product, and/or a CP test program, and alternatively, the file or message may comprise version information content. In one example, the old gating rules version may be stored in a file and the version information may be encoded in the file name or stored in the file, and the version number can be determined by detecting numerous file names or version information therein. In another example, the old gating rules version may be stored in one or more tables/objects in a relational database/object database and the version information may stored in related tables/objects, and the determination can be achieved by detecting version information in the related tables/objects. In step S423, the received gating rules are stored. In one example, the entire received file is stored in the storage device 13 of the computer 22. In another example, gating rules and version information in the received message are stored in a file in suitable format. In yet another example, gating rules in the received message are stored in a file with a file name corresponding to the version information in the message. In still another example, gating rules and version information in the received message are stored in one or more tables/objects. In step S424, the old gating rules version is replaced with new gating rules version in the received file or message. In one example, the entire file storing old version of gating rule is replaced with the received file. In another example, old gating rules version and version information in a file are replaced with gating rules and version information in the received message. In yet another example, old gating rules version in a file are replaced with gating rules in the received message and the file name of the existing file is renamed according to the version information in the received message. In still another example, old gating rules version and version information in one or more tables/objects is replaced with gating rules and version information in the received message. In step S426, CP test results are acquired. The CP test results may be acquired from one or more files, relational tables, data objects or others, or from one or more CP test stations via the network 30. In step S426, the CP test results are carried into the newest gating rules to generate advisory reports. In step S427, the advisory reports are displayed or printed through the output device 15 of the computer 22.

Figure 5:
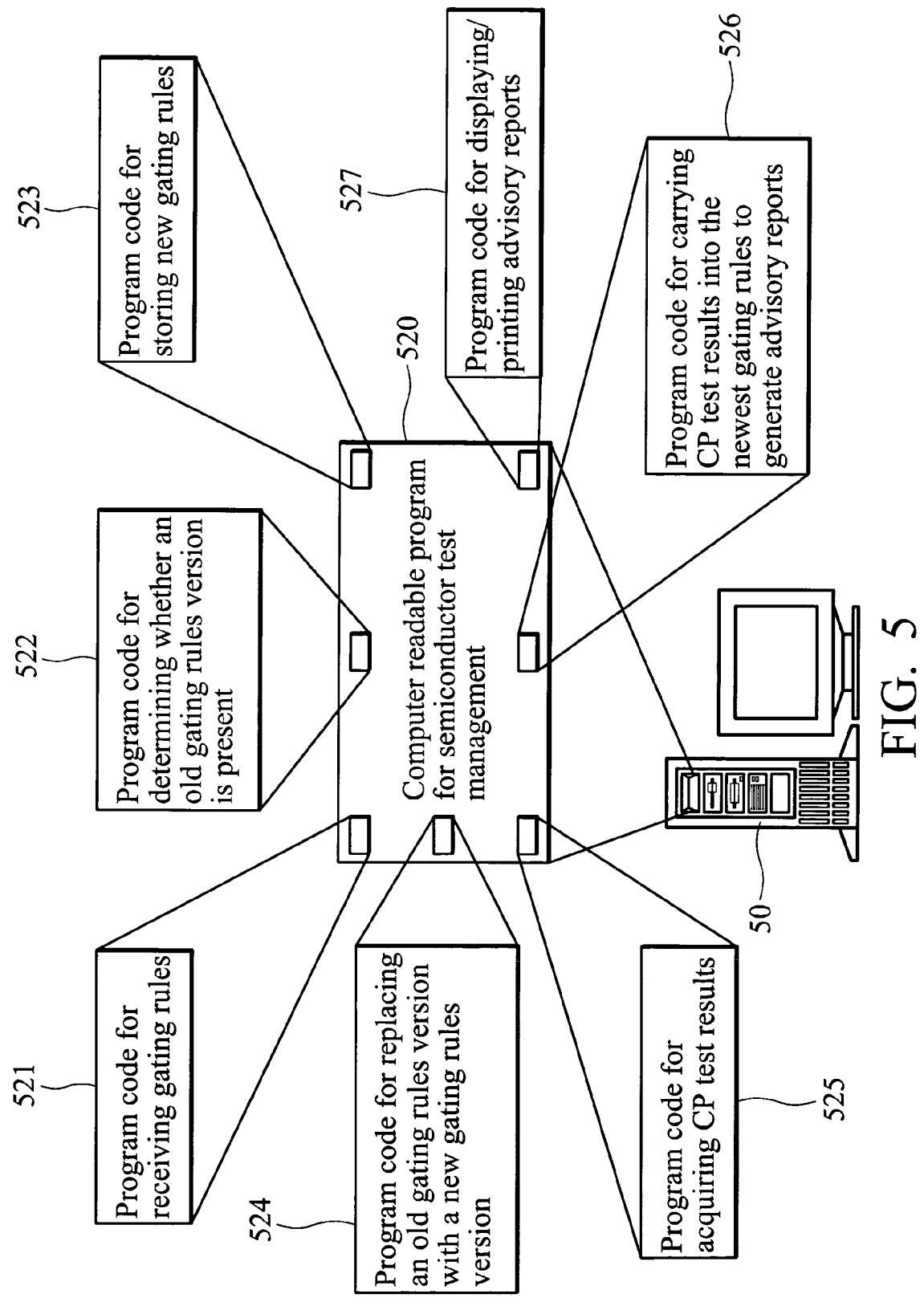
FIG. 5 is a diagram of a storage medium for storing a computer program providing the method of semiconductor test management according to a first embodiment of the invention.

Also disclosed is a storage medium as shown in FIG. 5 storing a computer program 520 providing the disclosed method of semiconductor test management. The computer program product includes a storage medium 50 having computer readable program code embodied in the medium for use in a computer system. The computer readable program code comprises at least computer readable program code 521 receiving gating rules, computer readable program code 522 determining whether an old gating rules version is present, computer readable program code 523 storing new gating rules, computer readable program code 524 replacing an old gating rules version with a new gating rules version, computer readable program code 525 acquiring CP test results, computer readable program code 526 carrying CP test results into the newest gating rules to generate advisory reports and computer readable program code 527 displaying/printing advisory reports.

SECOND EMBODIMENT

Figure 6:
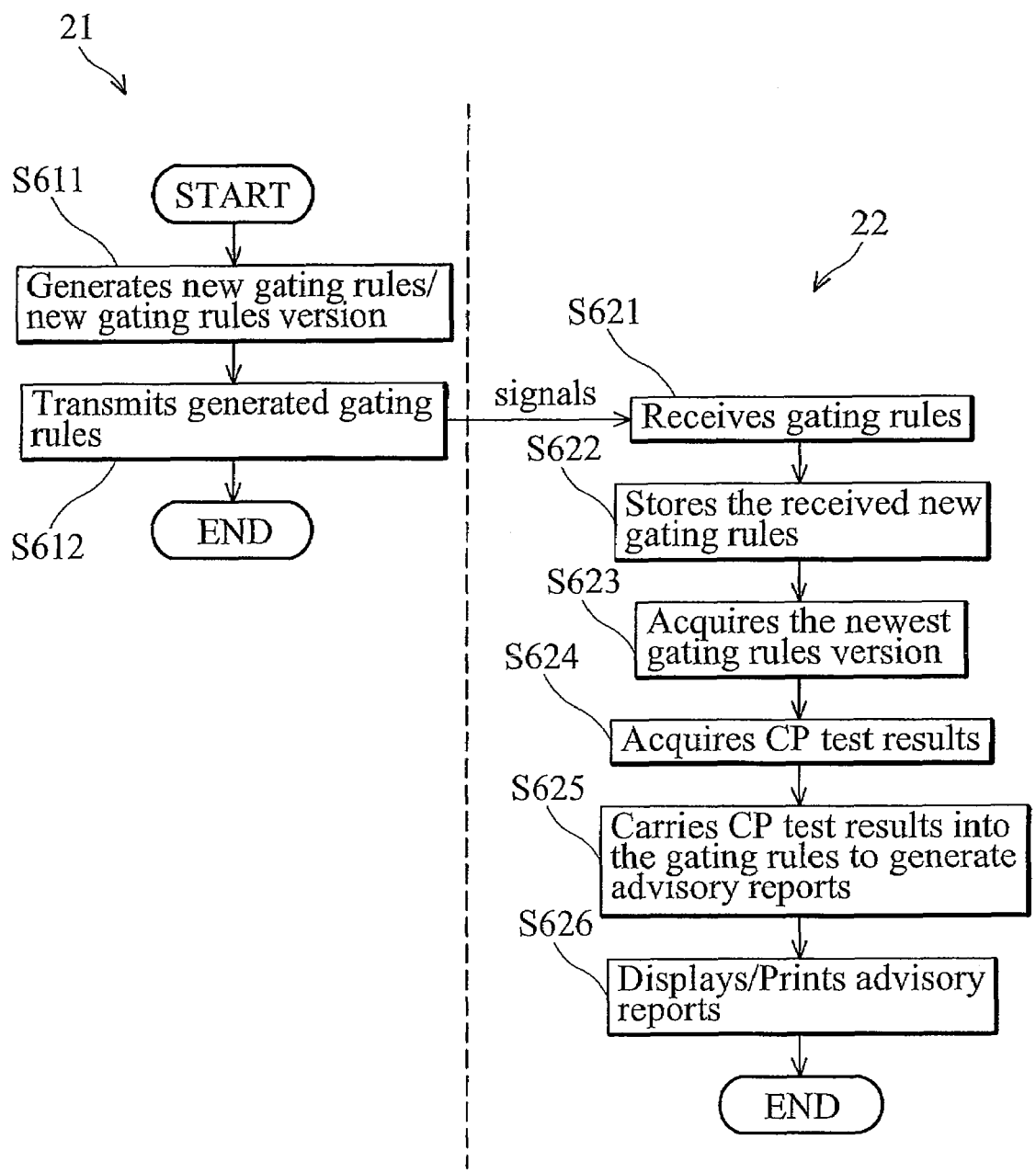
FIG. 6 is a flowchart showing a method of semiconductor test management according to a second embodiment of the invention.

A second embodiment of the invention discloses a method for semiconductor test management using a publishing strategy. The method is implemented in program modules, the parts of method executed by the processing unit 11 of computers 21, wherein some parts of the method are executed by the processing unit 11 of 22. FIG. 6 is a flowchart showing a method of semiconductor test management according to the second embodiment. The method of FIG. 6 is divided into two sections, a left section indicating the parts of the method performed by the computer 21, and a right section indicating the parts performed by the computer 22. The two sections shown in FIG. 6 are separated by a dashed line for added clarity.

In step S611, new gating rules or new gating rules version are generated by the computer 21. The computer 21 may provide a GUI to facilitate interaction with the generation of the gating rules, such as inserting a new rule, deleting a rule, modifying specification of a rule. The GUI can also provide additional response to information requests as required. Alternatively, the computer 21 may import new rules or new version of rules provided by a client, from a file in a nonvolatile storage medium such as a hard disk, a floppy disk, an optical disk, a portable disk and the like, or a remote computer via the network 30. The generated gating rules may be stored to a file or message in a suitable format such as ASCII text file, XML file, database export file, SOAP message. In step S612, the generated gating rules are transmitted to the computer 22 via a relevant network protocol such as FTP, SMTP, SOAP, HTTP and the like, with a relevant software application such as a FTP client/server, SMTP client/server, SOAP message encoder, XML message encoder and the like.

In step S621, the computer 22 receives a file or a message comprising gating rules via its communication device 16. In step S622, the gating rules in the received file or message are stored. The file name of the received file comprising gating rules may follow a naming rule to identify the gating rules version for a client, a semiconductor product, and/or a CP test program, and alternatively, the file or message may comprise the content of version information. In one example, the entire received file is stored in the storage device 13 of the computer 22. In another example, gating rules and version information in the received message are stored in a file in suitable format. In yet another example, gating rules in the received message are stored in a file with a file name corresponding to the version information in the message. In still another example, gating rules and version information in the received message are stored in one or more tables/objects. In step S623, the newest gating rules version is acquired. The acquisition of the newest gating rules version can be achieved by comparing file names, or version information in one or more files, tables or data objects. In step S624, CP test results are acquired. The CP test results may be acquired from one or more files, relational tables, data objects or others, or from one or more CP test stations via the network 30. In step S625, the CP test results are carried into the newest gating rules to generate advisory reports. In step S626, the advisory reports are displayed or printed through the output device 15 of the computer 22.

Figure 7:
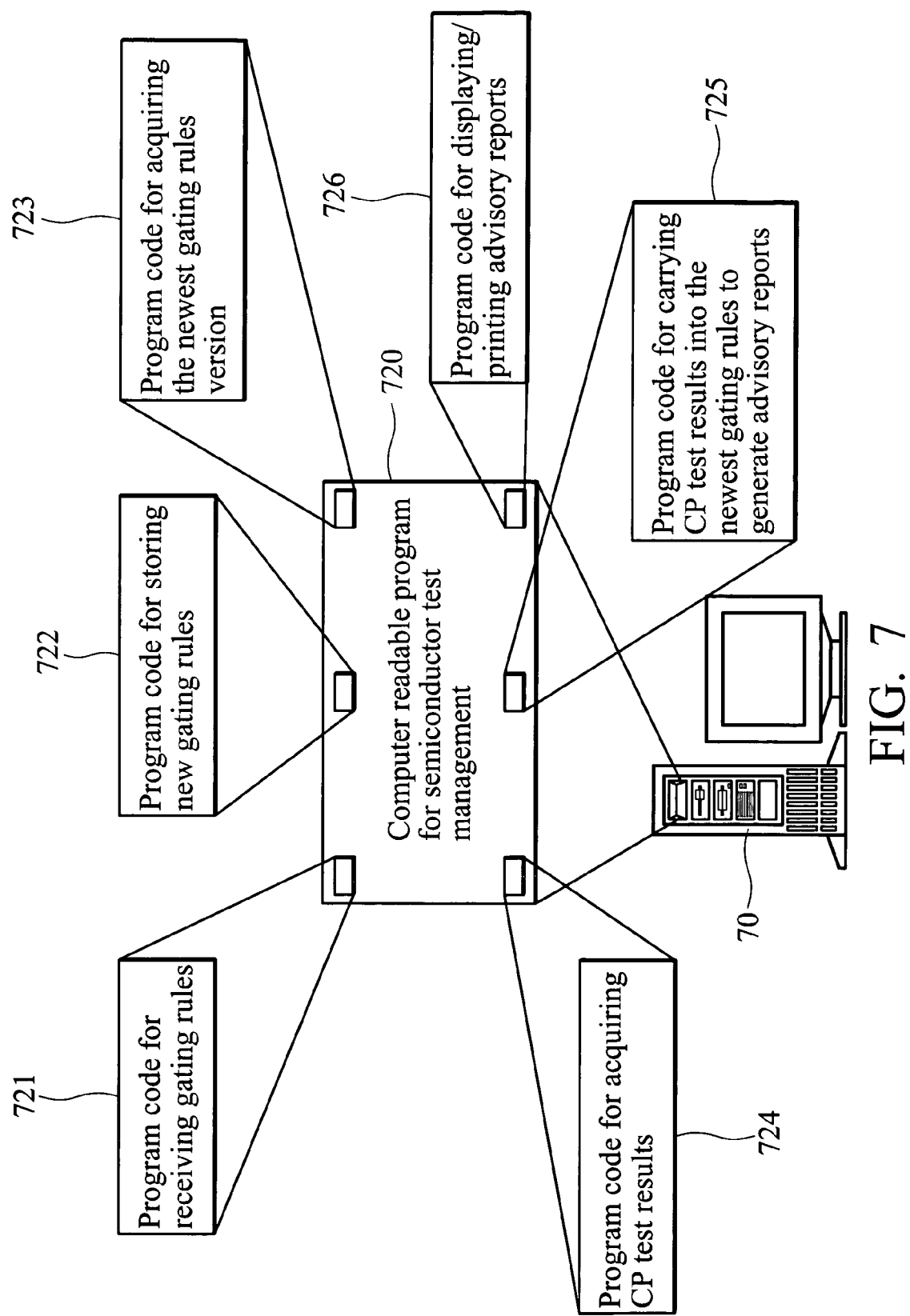
FIG. 7 is a diagram of a storage medium for storing a computer program providing the method of semiconductor test management according to a second embodiment of the invention.

Also disclosed is a storage medium as shown in FIG. 7 storing a computer program 720 providing the disclosed method of semiconductor test management. The computer program product includes a storage medium 70 having computer readable program code embodied in the medium for use in a computer system. The computer readable program code comprises at least computer readable program code 721 receiving gating rules, computer readable program code 722 storing new gating rules, computer readable program code 723 acquiring the newest gating rules version, computer readable program code 724 acquiring CP test results, computer readable program code 725 carrying CP test results into the newest gating rules to generate advisory reports and computer readable program code 726 displaying/printing advisory reports.

THIRD EMBODIMENT

Figure 8A:
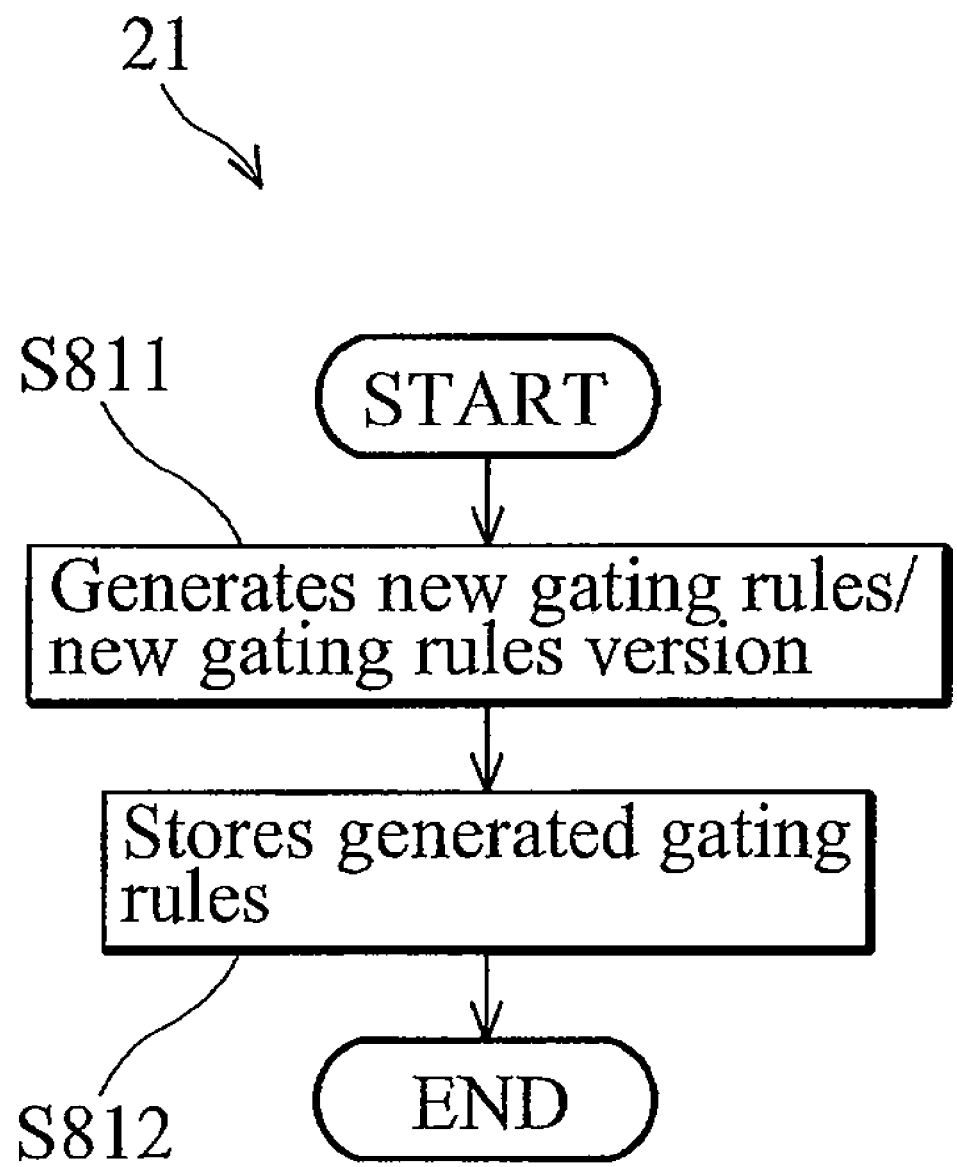
FIGS. 8a and 8b are flowcharts showing a method of semiconductor test management according to the third embodiment of the invention.
Figure 8B:
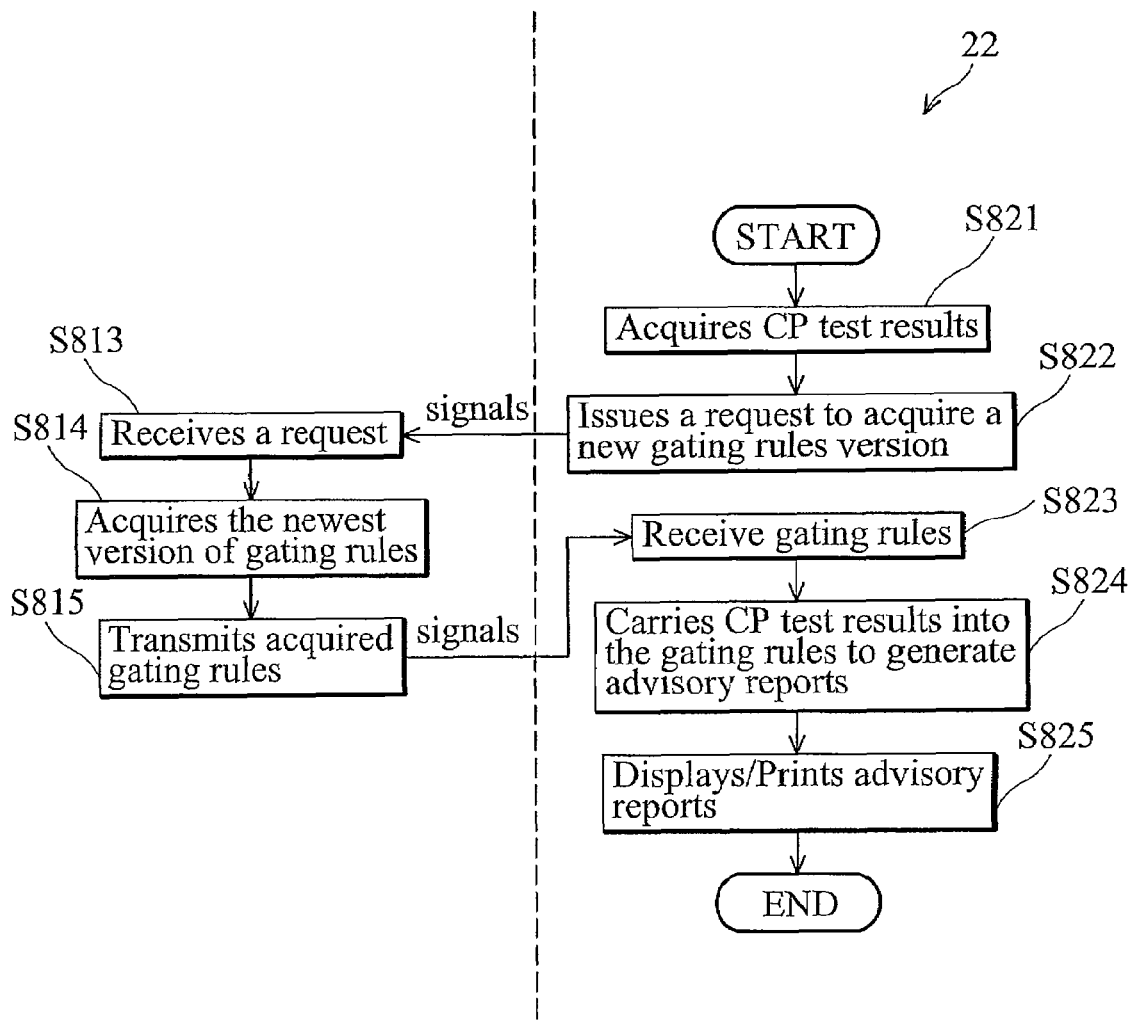

A third embodiment of the invention discloses a method for semiconductor test management using a subscribing strategy. The method is implemented in program modules, the parts of method executed by the processing unit 11 of computers 21, wherein some parts of the method are executed by the processing unit 11 of 22. FIGS. 8a and 8b are flowcharts showing a method of semiconductor test management according to the third embodiment. The method of FIG. 8b is divided into two sections, a left section indicating the parts of the method performed by the computer 21, and a right section indicating the parts performed by the computer 22. The two sections shown in FIG. 8 are separated by a dashed line for added clarity.

In step S811, new gating rules or new gating rules version are generated by the computer 21. The computer 21 may provide a GUI to facilitate interaction with the generation of the gating rules, such as inserting a new rule, deleting a rule, modifying rule specifications. The GUI can also provide additional response to information requests as required. Alternatively, the computer 21 may import new rules or new rules version provided by a client, from a file in a nonvolatile storage medium such as a hard disk, a floppy disk, an optical disk, a portable disk and the like, or a remote computer via the network 30. In step S812, the newly generated gating rules are stored in the storage device 13 of the computer 21. The generated gating rules with their version information (if required) may be stored to a file in a suitable format such as ASCII text file, XML file, relational database export file or SOAP message, and alternatively, stored to one or more database tables/data objects. The file name of the generated file comprising gating rules may follow a naming rule to identify gating rules version for a client. There may be a single file for storage of up-to-date gating rules or multiple gating rules version, or may be multiple files for storage of different gating rules versions.

In step S821, the computer 22 acquires CP test results may be from one or more files, relational tables, data objects or others, or from one or more CP test stations via the network 30. In order to acquire up-to-date gating rules, in step S822, a request is issued to the computer 21.

In step S813, the request is received by the computer 21. In step S814, the newest gating rules version is acquired from one or more files, tables or data objects. In step S815, the a file or a message comprising the acquired gating rules is transmitted to the computer 22 via a relevant network protocol such as FTP, SMTP, SOAP, HTTP and the like, with a relevant software application such as a FTP client/server, SMTP client/server, SOAP message encoder, XML message encoder and the like.

In step S823, the computer 22 receives a file or a message comprising gating rules via its communication device 16. In step S824, the CP test results are carried into the newest gating rules to generate advisory reports. In step S825, the advisory reports are displayed or printed through the output device 15 of the computer 22.

Figure 9:
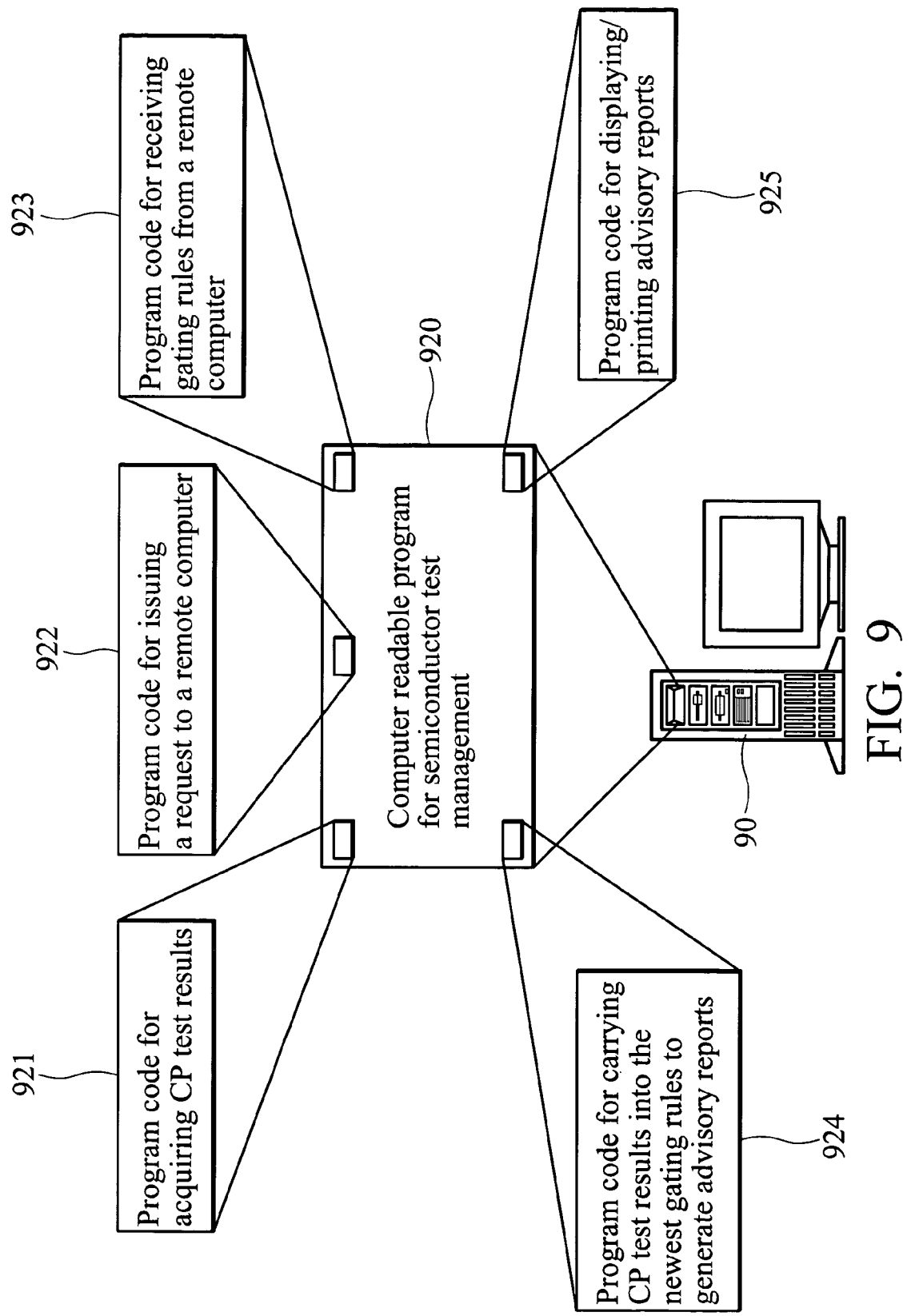
FIG. 9 is a diagram of a storage medium for storing a computer program providing the method of semiconductor test management according to a third embodiment of the invention.

Also disclosed is a storage medium as shown in FIG. 9 storing a computer program 920 providing the disclosed method of semiconductor test management. The computer program product includes a storage medium 90 having computer readable program code embodied in the medium for use in a computer system. The computer readable program code comprises at least computer readable program code 921 acquiring CP test results, computer readable program code 922 issuing a request to a remote computer, computer readable program code 923 receiving gating rules from a remote computer, computer readable program code 924 carrying CP test results into the newest gating rules to generate advisory reports and computer readable program code 925 displaying/printing advisory reports.

Although embodiments of the invention have been described in relation to CP testing, it is not intended to limit the invention. Those who are skilled in this technology can still apply the disclosed embodiments to in-line testing, wafer acceptance testing (WAT) or other semiconductor device/product testing systems/processes.

The methods and systems of the embodiments, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Although the present invention has been described in preferred embodiment, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A system for semiconductor test management, the system comprising:
a first computer generating a new gating rule and transmitting the new gating rule; and
a second computer initially storing an old gating rule, receiving the new gating rule via a network, replacing the old gating rule with the new gating rule, acquiring a test result, carrying the test result into the new gating rule to generate an advisory report;
wherein the test result comprises a test value corresponding to a test attribute, the new gating rule determines a final advisory when the test value satisfies a specific condition comprising the test attribute, the advisory report comprises the final advisory, the new gating rule is a newer version of the old gating rule, and the final advisory indicates a wafer, or a wafer lot is accepted, scrapped, repairable, or held for analysis.

2. The system of claim 1 wherein the second computer issues a request to the first computer to acquire the new gating rule, and the first computer transmits the new gating rule after receiving the request.

3. The system of claim 1 wherein the first computer transmits a plurality of gating rule versions with version information thereof to the second computer, and the second computer stores the gating rule versions and acquires the newest gating rule version as the new gating rule.

4. The system of claim 3 wherein the second computer stores each gating rule version in a file with a file name comprising the corresponding version information, and acquires the newest gating rule version by detecting the file name.

5. The system of claim 3 wherein the second computer stores each gating rule version and the corresponding version information in a database table, and acquires the newest gating rule version by detecting the version information from the database table.

6. The system of claim 3 wherein the second computer stores each gating rule version and the corresponding version information in a data object, and acquires the newest gating rule version by detecting the version information from the data object.

7. The system of claim 1 wherein the test result is generated by circuit probe (CP) testing, wafer acceptance testing (WAT) or in-line testing.

8. The system of claim 1 wherein the new gating rule is stored in a file or a message for data transmission between the first computer and the second computer.

9. The system of claim 8 wherein the message is an extensible markup language (XML) message or simple object access protocol (SOAP) message.

10. The system of claim 1 wherein the new gating rule is transmitted by file transfer protocol (FTP), simple mail transfer protocol (SMTP), simple object access protocol (SOAP) or hypertext transfer protocol (HTTP).

11. The system of claim 1 wherein the test attribute comprises a yield value, quantity of good dies, quantity of repairable dies, quantity of bad dies, electrical parameters or physical parameters.

12. The system of claim 1 wherein the second computer displays or prints the advisory report.

13. A method of semiconductor test management, the method comprising using a first computer and a second computer to perform the steps of:
generating a new gating rule with the first computer;
transmitting the new gating rule with the first computer;
initially storing an old gating rule with the second computer;
receiving the new gating rule via a network, with the second computer;
replacing the old gating rule with the new gating rule, with the second computer;
acquiring a test result with the second computer; and
carrying the test result into the new gating rule to generate an advisory report, with the second computer;
wherein the test result comprises a test value corresponding to a test attribute, the new gating rule determines a final advisory when the test value satisfies a specific condition comprising the test attribute, the advisory report comprises the final advisory, the new gating rule is a newer version of the old gating rule, and the final advisory indicates a wafer, or a wafer lot is accepted, scrapped, repairable, or held for analysis.

14. The method of claim 13 further comprising the steps of:
issuing a request to the first computer to acquire the new gating rule, with the second computer; and
transmitting the new gating rule after receiving the request with the first computer.

15. The method of claim 13 further comprising the steps of:
transmitting a plurality of gating rule versions with version information thereof to the second computer, with the first computer;
storing the gating rule versions with the second computer; and
acquiring the newest gating rule version as the new gating rule, with the second computer.

16. The method of claim 15 further comprising the steps of:
storing each gating rule version in a file with a file name comprising the corresponding version information, with the second computer; and
acquires the newest gating rule version by detecting the file name with the second computer.

17. The method of claim 15 further comprises the steps of:
storing each gating rule version and the corresponding version information in a database table, with the second computer; and
acquiring the newest gating rule version by detecting the version information from the database table.

18. The method of claim 15 further comprises the steps of:
storing each gating rule version and the corresponding version information in a data object, with the second computer; and
acquiring the newest gating rule version by detecting the version information from the data object.

19. The method of claim 13 wherein the test result is generated by circuit probe (CP) testing, wafer acceptance testing (WAT) or in-line testing.

20. The method of claim 13 wherein the new gating rule is stored in a file or a message for data transmission between the first computer and the second computer.

21. The method of claim 20 wherein the message is an extensible markup language (XML) message or simple object access protocol (SOAP) message.

22. The method of claim 13 wherein the new gating rule is transmitted by file transfer protocol (FTP), simple mail transfer protocol (SMTP), simple object access protocol (SOAP) or hypertext transfer protocol (HTTP).

23. The method of claim 13 wherein the test attribute comprises a yield value, quantity of good dies, quantity of repairable dies, quantity of bad dies, electrical parameters or physical parameters.

24. The method of claim 13 further comprising a step of displaying or printing the advisory report with the second computer.

25. A machine-readable storage medium for storing a computer program which, when executed, performs a method of semiconductor test management, the method comprising the steps of:
   generating a new gating rule with the first computer;
   transmitting the new gating rule with the first computer;
   initially storing an old gating rule with the second computer;
   receiving the new gating rule via a network, with the second computer;
   replacing the old gating rule with the new gating rule, with the second computer;
   acquiring a test result with the second computer; and
   carrying the test result into the new gating rule to generate an advisory report, with the second computer;
   wherein the test result comprises a test value corresponding to a test attribute, the new gating rule determines a final advisory when the test value satisfies a specific condition comprising the test attribute, the advisory report comprises the final advisory, the new gating rule is a newer version of the old gating rule, and the final advisory indicates a wafer, or a wafer lot is accepted, scrapped, repairable, or held for analysis.

* * * * *